(12) United States Patent
Seo et al.

(10) Patent No.: US 11,558,012 B2
(45) Date of Patent: Jan. 17, 2023

(54) OSCILLATOR AND METHOD OF DRIVING THE SAME

(71) Applicant: LX SEMICON CO., LTD., Daejeon (KR)

(72) Inventors: Young Ho Seo, Daejeon (KR); Seung Hun Shin, Daejeon (KR); Kyu Ho Kim, Daejeon (KR); Won Joon Hwang, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 17/546,357

(22) Filed: Dec. 9, 2021

(65) Prior Publication Data

US 2022/0190783 A1 Jun. 16, 2022

(30) Foreign Application Priority Data

Dec. 16, 2020 (KR) ........................ 10-2020-0176004

(51) Int. Cl.
*H03K 3/0231* (2006.01)
*H03K 3/011* (2006.01)
*H03B 19/08* (2006.01)
*H03B 19/20* (2006.01)

(52) U.S. Cl.
CPC ............ *H03B 19/08* (2013.01); *H03B 19/20* (2013.01); *H03K 3/011* (2013.01); *H03K 3/0231* (2013.01); *H03B 2202/073* (2013.01)

(58) Field of Classification Search
CPC ............ H03B 2202/073; H03K 3/011; H03K 3/0231; H03K 4/50; H03K 4/501
See application file for complete search history.

(56) References Cited

U.S. PATENT DOCUMENTS 5,670,915 A * 9/1997 Cooper ................ H03K 3/0231
331/111
5,760,655 A * 6/1998 Roohparvar ......... H03K 3/0231
331/111

(Continued)

FOREIGN PATENT DOCUMENTS

JP 2014-75744 A 4/2014
KR 10-2016-0029593 A 3/2016
KR 10-2019-0141868 A 12/2019

*Primary Examiner* — Levi Gannon
(74) *Attorney, Agent, or Firm* — Harness, Dickey & Pierce, P.L.C.

(57) ABSTRACT

The present disclosure relates to an oscillator including a charge and discharge circuit which generates a first oscillation signal according to a clock signal using a first constant current and a second oscillation signal according to an inverted clock signal using a second constant current, an integrating circuit which generates a first comparison voltage reflecting an amount of change in the first oscillation signal based on a comparison reference voltage and a second comparison voltage reflecting an amount of change in the second oscillation signal based on the comparison reference voltage, and a comparison circuit which generates the clock signal and the inverted clock signal according to a result of comparison between the first oscillation signal and the first comparison voltage and a result of comparison between the second oscillation signal and the second comparison voltage.

14 Claims, 5 Drawing Sheets

(56) References Cited

U.S. PATENT DOCUMENTS

| | | | |
|---|---|---|---|
| 7,847,648 B2* | 12/2010 | Hu | H03K 3/011 |
| | | | 331/143 |
| 9,507,373 B2 | 11/2016 | Bode et al. | |
| 2011/0140754 A1* | 6/2011 | Tokunaga | H03K 4/501 |
| | | | 327/306 |
| 2013/0038364 A1* | 2/2013 | Tokairin | H03K 4/501 |
| | | | 327/156 |
| 2017/0104475 A1* | 4/2017 | Lam | H03K 4/502 |

* cited by examiner

OSCILLATOR AND METHOD OF DRIVING THE SAME

CROSS-REFERENCE TO RELATED APPLICATIONS

This application claims the benefit of the Korean Patent Application No. 10-2020-0176004 filed on Dec. 16, 2020, which is hereby incorporated by reference as if fully set forth herein.

FIELD OF THE INVENTION

The present disclosure relates to an oscillator which generates a clock signal having a high-precision frequency and a method of driving the same.

BACKGROUND

An electronic apparatus includes an oscillator which generates a signal having a frequency. For example, an oscillator embedded in an electronic apparatus generates a clock signal having a set frequency, and the electronic apparatus operates based on the clock signal of the oscillator. The oscillator should generate a precise and stable clock signal for reliability of the electronic apparatus.

In an oscillator according to the related art, a reset-set (RS) latch circuit may generate a clock signal according to a result of comparison between first and second oscillation signals, which are generated by capacitors which periodically perform charging and discharging operations, and a reference voltage, and the charging and discharging operations of the capacitors may be controlled by the clock signal that is fed back and an inverted clock signal.

The first and second oscillation signals may be changed in an unbalanced manner due to various causes, such as process deviations or surrounding environments, and in the oscillator according to the related art, since the clock signal is generated according to the result of comparison between the first and second oscillation signals and one reference voltage, an error in which a duty cycle of the clock signal is changed may occur due to the unbalanced first and second oscillation signals.

SUMMARY

Accordingly, the present disclosure is designed to solve the problem described above and to provide an oscillator capable of generating a clock signal having a high-precision frequency and a method of driving the same.

An oscillator according to one aspect of the present disclosure, to achieve the objectives described above, includes a charge and discharge circuit which generates a first oscillation signal according to a clock signal using a first constant current and a second oscillation signal according to an inverted clock signal using a second constant current, an integrating circuit which generates a first comparison voltage reflecting an amount of change in the first oscillation signal based on a comparison reference voltage and a second comparison voltage reflecting an amount of change in the second oscillation signal based on the comparison reference voltage, and a comparison circuit which generates the clock signal and the inverted clock signal according to a result of comparison between the first oscillation signal and the first comparison voltage and a result of comparison between the second oscillation signal and the second comparison voltage.

The oscillator may further include a bias circuit which generates a bias reference voltage and the comparison reference voltage according to a frequency control signal and generates a bias current using the bias reference voltage, wherein the charge and discharge circuit may generate the first and second constant currents proportional to the bias current by mirroring the bias current.

The integrating circuit may include a first integrator which generates the first comparison voltage by integrating a difference between the first oscillation signal and the comparison reference voltage and a second integrator which generates the second comparison voltage by integrating the second oscillation signal and the comparison reference voltage. Each of the first comparison voltage and the second comparison voltage may be greater than the comparison reference voltage.

The first integrator may receive the first oscillation signal through a first input resistor connected to a first-1 input terminal in series, the comparison reference voltage through a first-2 input terminal, and a first intermediate signal formed by adding a voltage fed back from the first comparison voltage output through a first output terminal through a first feedback capacitor, to an output power of the first input resistor through the first-1 input terminal and integrate the first oscillation signal, the comparison reference voltage, and the first intermediate signal. The second integrator may receive the second oscillation signal through a second input resistor connected to a second-1 input terminal in series, the comparison reference voltage through a second-2 input terminal, and a second intermediate signal formed by adding a voltage fed back from the second comparison voltage output through a second output terminal through a second feedback capacitor, to an output power of the second input resistor through the second-1 input terminal and integrate the second oscillation signal, the comparison reference voltage, and the second intermediate signal.

The first intermediate signal may be proportional to the amount of change in the first oscillation signal based on the comparison reference voltage and may converge on the comparison reference voltage, and the second intermediate signal may be proportional to the amount of change in the second oscillation signal based on the comparison reference voltage and may converge on the comparison reference voltage. A level of the first comparison voltage may be changed according to a change of the first intermediate signal, and a level of the second comparison voltage may be changed according to a change of the second intermediate signal.

The comparison circuit may include a first comparator which outputs a first logic signal according to the result of comparison between the first oscillation signal and the first comparison voltage, a second comparator which outputs a second logic signal according to the result of comparison between the second oscillation signal and the second comparison voltage, and a set-reset (SR) latch circuit which receives the first logic signal as a set signal and the second logic signal as a reset signal and generates and outputs the clock signal alternating between a first logic level and a second logic level and the inverted clock signal having a phase inverted from that of the clock signal.

The bias circuit may include a reference voltage generator which generates the bias reference voltage and the comparison reference voltage which is less than the bias reference voltage according to the frequency control signal and a bias current generator which generates a constant current proportional to the bias reference voltage as the bias current, wherein the bias current generator may further include a temperature compensation resistor part to which the bias current is supplied and which maintains a constant resistance value according to a change in temperature.

The charge and discharge circuit may include a constant current generator which generates the first and second constant currents by mirroring the bias current, a first charge and discharge part which generates the first oscillation signal through charging and discharging operations of a first capacitor according to control of the clock signal using the first constant current, and a second charge and discharge part which generates the second oscillation signal through charging and discharging operations of a second capacitor according to control of the inverted clock signal using the second constant current.

The bias current generator and the constant current generator may include a first current mirror which generates the bias current and the first and second constant currents and a cascode stage connected to an output terminal of the first current mirror in series, wherein the bias current and the first and second constant currents may be output through the cascode stage.

The oscillator may further include a self-bias circuit which is connected to the bias current generator in parallel, generates an initial bias current, and supplies the initial bias current to the bias current generator and a power noise canceling part including a first capacitor and a first resistor, which are disposed between and connected to a high-potential power line and a gate electrode of the first current mirror, and a second capacitor and a second resistor which are disposed between and connected to the high-potential power line and a gate electrode of the cascode stage.

A method of driving an oscillator according to one aspect of the present disclosure, to achieve the objectives described above, includes generating a first constant current and a second constant current using a bias current, generating a first oscillation signal according to a clock signal using the first constant current and generating a second oscillation signal using the second constant current, generating a first comparison voltage reflecting an amount of change in the first oscillation signal based on a comparison reference voltage and generating a second comparison voltage reflecting an amount of change in the second oscillation signal based on the comparison reference voltage, and generating the clock signal and the inverted clock signal according to a result of comparison between the first oscillation signal and the first comparison voltage and a result of comparison between the second oscillation signal and the second comparison voltage.

The method may further include generating a bias reference voltage and the comparison reference voltage according to a frequency control signal and the bias current using the bias reference voltage, wherein the first and second constant currents, which are proportional to the bias current, may be generated by mirroring the bias current.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
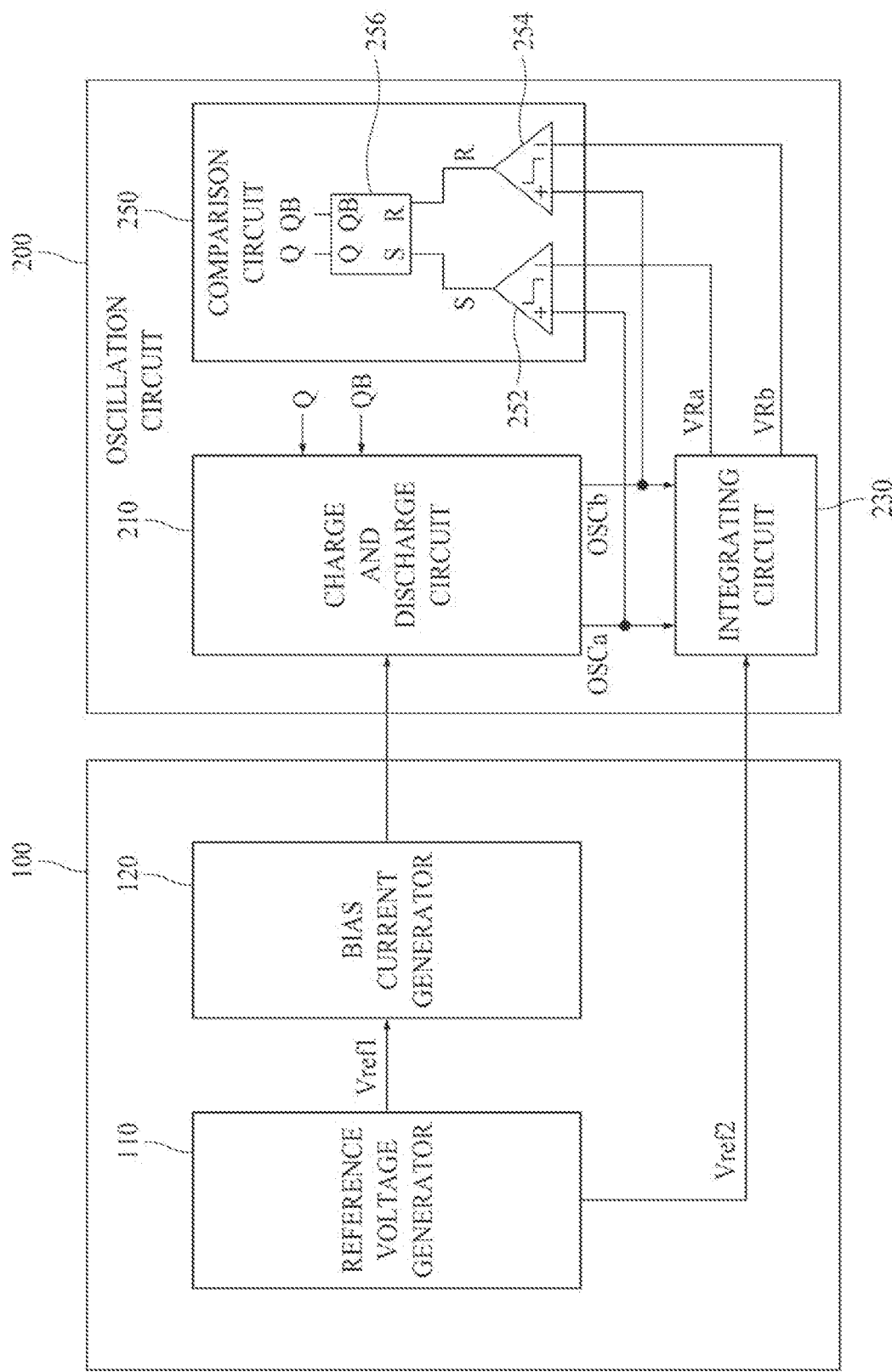
FIG. 1 is a block diagram illustrating a configuration of an oscillator according to one embodiment.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. The expression that an element is "connected," "coupled," or "adhered" to another element or layer, the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described with reference to the accompanying drawings.

FIG. 1 is a block diagram illustrating a configuration of an oscillator according to one embodiment;

Referring to FIG. 1, the oscillator may include a bias circuit 100 and an oscillation core circuit 200.

The bias circuit 100 may generate first and second reference voltages Vref1 and Vref2 and a constant current proportional to the first reference voltage Vref1 as a bias current by adjusting a resistor according to a frequency control signal. The first reference voltage Vref1 may be defined as a bias reference voltage, and the second reference voltage Vref2 may be defined as a comparison reference voltage.

The oscillation core circuit 200 may generate first and second oscillation signals OSCa and OSCb through periodic charging and discharging operations of capacitors using the constant current proportional to a bias current generated in the bias circuit 100. The oscillation core circuit 200 may individually integrate changes of the first and second oscillation signals OSCa and OSCb based on the second reference voltage Vref2 to generate a first comparison voltage VRa reflecting the change of the first oscillation signal OSCa and a second comparison voltage VRb reflecting the change of the second oscillation signal OSCb. The oscillation core circuit 200 may generate a clock signal Q and an inverted clock signal QB which alternate between a first logic level and a second logic level according to a result of comparison between the first oscillation signal OSCa and the first comparison voltage VRa and a result of comparison between the second oscillation signal OSCb and the second comparison voltage VRb.

The oscillator may increase a frequency of the clock signal Q when the first reference voltage Vref1 increases and decrease the frequency of the clock signal Q when the second reference voltage Vref2 increases according to the frequency control signal.

Referring to FIG. 1, the bias circuit 100 may include a reference voltage generator 110 and a bias current generator 120. The oscillation core circuit 200 may include a charge and discharge circuit 210, an integrating circuit 230, and a comparison circuit 250.

In the bias circuit 100, the reference voltage generator 110 may generate and output the first and second reference voltages Vref1 and Vref2 adjusted according to the frequency control signal using the frequency control signal and a voltage distribution circuit.

In the bias circuit 100, the bias current generator 120 may generate the constant current proportional to the first reference voltage Vref1 as the bias current using the first reference voltage Vref1 received from the reference voltage generator 110.

In the oscillation core circuit 200, the charge and discharge circuit 210 may generate a mirrored constant current by mirroring the constant current generated in the bias current generator 120 and the first and second oscillation signals OSCa and OSCb having triangular waveforms having different phases by periodically charging and discharging the capacitors according to the clock signal Q and the inverted clock signal QB using the mirrored constant current.

In the oscillation core circuit 200, the integrating circuit 230 may integrate and average an amount of change in the first oscillation signal OSCa based on the second reference voltage Vref2 to reflect the small change of the first oscillation signal OSCa so as to generate the first comparison voltage VRa which is changed according to the change of the first oscillation signal OSCa. In the oscillation core circuit 200, the integrating circuit 230 may integrate and average an amount of change in the second oscillation signal OSCb based on the second reference voltage Vref2 to reflect the small change of the second oscillation signal OSCb so as to generate the second comparison voltage VRb which is changed according to the change of the second oscillation signal OSCb.

In the oscillation core circuit 200, the comparison circuit 250 may generate the clock signal Q and the inverted clock signal QB which alternate between the first logic level and the second logic level according to the result of comparison between the first oscillation signal OSCa and the first comparison voltage VRa and the result of comparison between the second oscillation signal OSCb and the second comparison voltage VRb.

The comparison circuit 250 may include a first comparator 252, a second comparator 254, and a set-reset (SR) latch circuit 256.

The first comparator 252 may generate a first logic signal S corresponding to the result of comparison between the first oscillation signal OSCa and the first comparison voltage VRa.

The second comparator 254 may generate a second logic signal R corresponding to the result of comparison between the second oscillation signal OSCb and the second comparison voltage VRb.

The SR latch circuit 256 may receive the first logic signal S as a set signal and the second logic signal R as a reset signal to generate the clock signal Q and the inverted clock signal QB.

Figure 2:
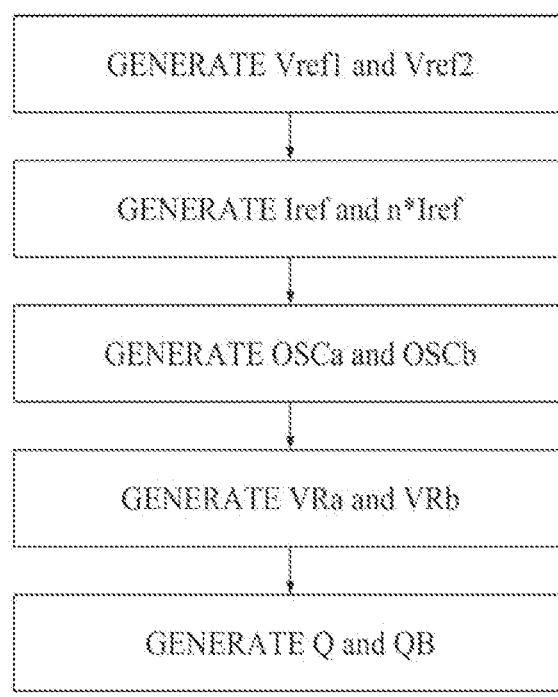
FIG. 2 is a flowchart illustrating a method of driving the oscillator according to one embodiment.

FIG. 2 is a flowchart illustrating a method of driving the oscillator according to one embodiment;

The oscillator illustrated in FIG. 1 may be driven according to the method of the driving illustrated in FIG. 2.

Referring to FIGS. 1 and 2, the method of driving the oscillator according to one embodiment may include generating the first reference voltage Vref1 and the second reference voltage Vref2 according to the frequency control signal, generating a bias current Iref using the first reference voltage Vref1 and first and second constant currents n*Iref which are mirrored from the bias current Iref, generating the first and second oscillation signals OSCa and OSCb through periodic charging and discharging operations of the capacitors according to the clock signal Q and the inverted clock signal QB using the first constant current n*Iref and the second constant current n*Iref, generating the first comparison voltage VRa reflecting the amount of change in the first oscillation signal OSCa based on the second reference voltage Vref2 and the second comparison voltage VRb reflecting the amount of change in the second oscillation signal OSCb based on the second reference voltage Vref2, and generating the clock signal Q and the inverted clock signal QB according to a result S of comparison between the first oscillation signal OSCa and the first comparison voltage VRa and a result R of comparison between the second oscillation signal OSCb and the second comparison voltage VRb.

As described above, in the method of driving the oscillator according to one embodiment, since the comparison circuit 250 uses the first and second comparison voltages VRa and VRb which are changed according to the changes of the first and second oscillation signals OSCa and OSCb, even when the first and second oscillation signals OSCa and OSCb are changed in an unbalanced manner, the clock signal having a constant duty-cycle, that is, a high-precision clock signal, can be generated and output.

Figure 3:
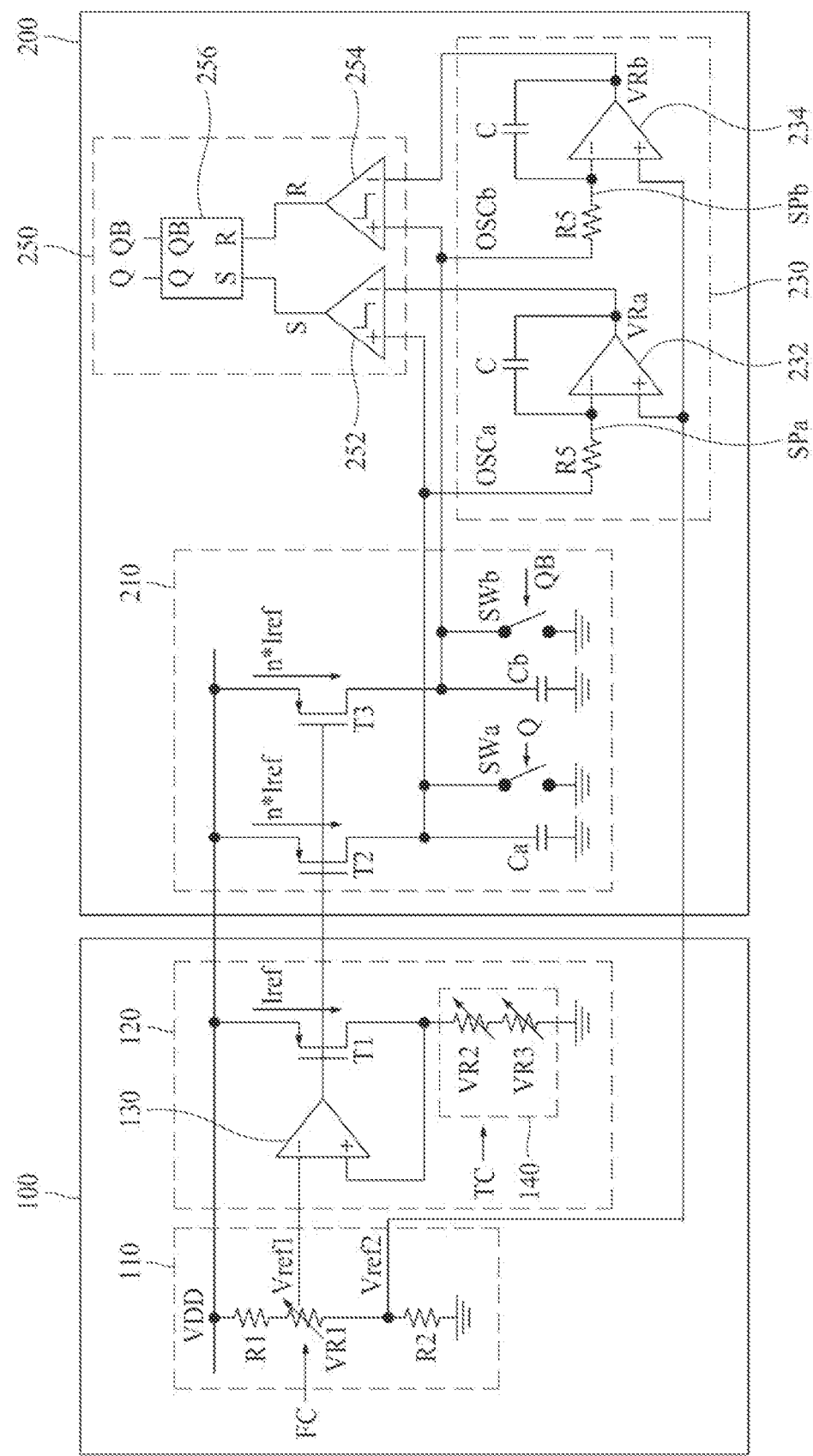
FIG. 3 is an equivalent circuit diagram illustrating the configuration of the oscillator according to one embodiment.
Figure 4:
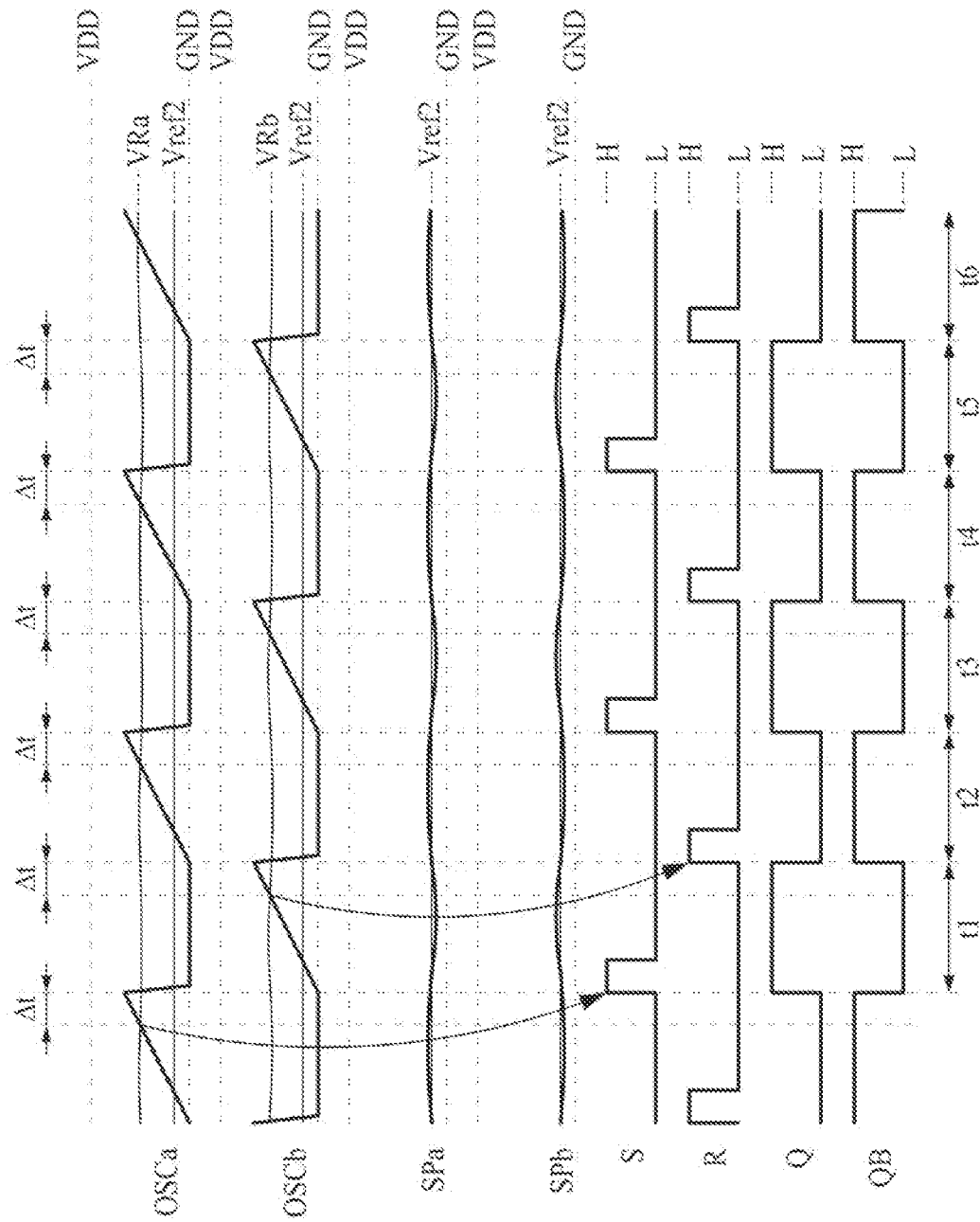
FIG. 4 is an operation waveform of the oscillator according to one embodiment.

FIG. 3 is an equivalent circuit diagram illustrating the configuration of the oscillator according to one embodiment, and FIG. 4 is an operation waveform of the oscillator according to one embodiment.

Referring to FIG. 3, the bias circuit 100 of the oscillator may include the reference voltage generator 110 and the bias current generator 120, and the oscillation core circuit 200 may include the charge and discharge circuit 210, the integrating circuit 230, and the comparison circuit 250.

The reference voltage generator 110 may generate and output the first and second reference voltages Vref1 and Vref2 adjusted according to a frequency control signal FC using a resistor string circuit (voltage distribution circuit) having a resistor VR1 changed according to the frequency control signal FC.

The reference voltage generator 110 may include the resistor string circuit having the plurality of resistors R1, VR1, and R2 connected in series between a high-potential power source VDD line and a low-potential power source GND line.

The reference voltage generator 110 may generate the first reference voltage Vref1 and output the first reference voltage Vref1 to the bias current generator 120 through a connection node between a first resistor R1 and a variable resistor VR1. The reference voltage generator 110 may generate the second reference voltage Vref2 and output the second reference voltage Vref2 to the oscillation core circuit 200 through a connection node between the variable resistor VR1 and a second resistor R2.

In the reference voltage generator 110, since a resistance value of the variable resistor VR1 disposed between and connected to the first and second resistors R1 and R2 is adjusted according to the frequency control signal FC, the first and second reference voltages Vref1 and Vref2 may be adjusted according to the frequency control signal FC.

The bias current generator 120 may include an operational amplifier 130, a first transistor T1, and a resistor part 140 and generate the constant current proportional to the first reference voltage Vref1 as the bias current Iref.

The operational amplifier 130 receives the first reference voltage Vref1 through an inverted input terminal (−) and a feedback voltage generated at a connection node between the transistor T1 and the resistor part 140 through a non-inverted input terminal (+). The operational amplifier 130 may generate a control voltage to maintain the feedback voltage applied to the resistor part 140 to be the same as the first reference voltage Vref1.

The first transistor T1 may generate the bias current Iref, which is the constant current, in response to the control voltage output from the operational amplifier 130. The transistor T1 may be formed as a P-channel metal-oxide-semiconductor (PMOS) transistor including a gate electrode connected to an output of the operational amplifier 130, an input electrode (source electrode) connected to the high-potential power source VDD line, and an output electrode (drain electrode) connected to the resistor part 140. Meanwhile, the first transistor T1 may be formed as an N-channel metal-oxide-semiconductor (NMOS) transistor.

The resistor part 140 may include a temperature compensation resistor part including variable resistors VR2 and VR3 of which resistance values are complementarily changed according to a change in temperature and maintaining a predetermined resistance value even when a temperature is changed. In the resistor part 140, the variable resistor VR2 having the resistance value which increases according to a change in temperature and the variable resistor VR3 having the resistance value which decreases according to the change in temperature are connected in series so that, even when a temperature is changed, the predetermined constant resistance value can be maintained and the bias current Iref output from the first transistor T1 can be constantly maintained. In the resistor part 140, the resistance values of the variable resistors VR2 and VR3 may be set according to a temperature coefficient trimming signal.

The charge and discharge circuit 210 may include a constant current generator which generates the constant current n*Iref by mirroring the bias current Iref of the bias current generator 120 and first and second charge and discharge parts which periodically charge and discharge according to the clock signal Q and the inverted clock signal QB using the constant current n*Iref output from the constant current generator.

In the charge and discharge circuit 210, the constant current generator may include second and third transistors T2 and T3 connected to the first transistor T1 of the bias current generator 120 in a current mirror structure. Gate electrodes of the first transistor T1 and the second and third transistors T2 and T3 may be connected to each other, and input electrodes (source electrodes) thereof may be commonly connected to the high-potential power source VDD line. An output electrode (drain electrode) of the second transistor T2 may be connected to the first charge and discharge part including a first capacitor Ca and a first switch SWa, and an output electrode (drain electrode) of the third transistor T3 may be connected to the second charge and discharge part including a second capacitor Cb and a second switch SWb. The second and third transistors T2 and T3 may output the constant current n*Iref, which is generated by mirroring the bias current Iref generated by the first transistor T1 and is proportional to the bias current Iref, to the charge and discharge part.

In the charge and discharge circuit 210, the first charge and discharge part may include the first capacitor Ca and the first switch SWa which are connected to the output electrode of the second transistor T2 in parallel and generate the first oscillation signal OSCa through a first node. The first capacitor Ca may be charged with the constant current n*Iref provided by the second transistor T2 of the constant current generator and generate the first oscillation signal OSCa increasing in a triangular waveform through the first node over charging time as illustrated in FIG. 4. The first switch SWa may pull-down the first oscillation signal OSCa by discharging the first capacitor Ca in response to the clock signal Q fed back from the comparison circuit 250.

In the charge and discharge circuit 210, the second charge and discharge part may include the second capacitor Cb and the second switch SWb which are connected to the output electrode of the third transistor T3 in parallel and generate the second oscillation signal OSCb through a second node. The second capacitor Cb may be charged with the constant current n*Iref provided by the third transistor T3 of the constant current generator and generate the second oscillation signal OSCb increasing in a triangular waveform through the second node over charging time as illustrated in FIG. 4. The second switch SWb may pull-down the second oscillation signal OSCb by discharging the second capacitor Cb in response to the inverted clock signal QB fed back from the comparison circuit 250.

As the first and second switches SWa and SWb are alternately switched according to the clock signal Q and the inverted clock signal QB, the first and second capacitors Ca and Cb perform charging and discharging operations, and thus the first and second oscillation signals OSCa and OSCb having the triangular waveforms may be generated as illustrated in FIG. 4.

The integrating circuit 230 may include a first integrator 232 and a second integrator 234.

The first integrator 232 may include an amplifier which receives a first intermediate signal SPa proportional to the change of the first oscillation signal OSCa through an inverted input terminal (−) and receives the second reference voltage Vref2 through a non-inverted input terminal (+), a feedback capacitor C disposed between and connected to an output terminal and the inverted input terminal (−), and an input resistor R5 which is connected to the inverted input terminal (−) in series and receives the first oscillation signal OSCa.

The first integrator 232 may integrate and average a difference between the first oscillation signal OSCa and the second reference voltage Vref2 over time to output the first comparison voltage VRa which is changed according to the change of the first oscillation signal OSCa and is greater than the second reference voltage Vref2 as illustrated in FIG. 4. The first intermediate signal SPa, which is formed by adding an input signal decreased from the first oscillation signal OSCa through the input resistor R5 to a signal fed back from the first comparison voltage VRa, which is an output signal, through the feedback capacitor C and which is supplied to the inverted input terminal (−) of the first integrator 232, is proportional to the change of the first oscillation signal OSCa based on the second reference voltage Vref2 and converges on the second reference voltage Vref2 as illustrated in FIG. 4. Accordingly, the first integrator 232 may generate the first comparison voltage VRa proportional to the change of the first oscillation signal OSCa by reflecting the small change of the first oscillation signal OSCa.

The second integrator 234 may include an amplifier which receives a second intermediate signal SPb proportional to the second oscillation signal OSCb through an inverted input terminal (−) and the second reference voltage Vref2 through a non-inverted input terminal (+), a feedback capacitor C disposed between and connected to an output terminal and the inverted input terminal (−), and an input resistor R5 which is connected to the inverted input terminal (−) in series and receives the second oscillation signal OSCb.

The second integrator 234 integrates and averages a difference between the second oscillation signal OSCb and the second reference voltage Vref2 over time to output the second comparison voltage VRb which is changed according to the change of the second oscillation signal OSCb and is greater than the second reference voltage Vref2 as illustrated in FIG. 4. The second intermediate signal SPb, which is formed by adding an input signal decreased from the second oscillation signal OSCb through the input resistor R5 to a signal fed back from the second comparison voltage VRb, which is an output signal, through the feedback capacitor C and which is supplied to the inverted input terminal (−) of the second integrator 234, is proportional to the change of the second oscillation signal OSCb based on the second reference voltage Vref2 and converges on the second reference voltage Vref2 as illustrated in FIG. 4. Accordingly, the second integrator 234 may generate the second comparison voltage VRb proportional to the second oscillation signal OSCb by reflecting the small change of the second oscillation signal OSCb.

The comparison circuit 250 may include the first comparator 252, the second comparator 254, and the SR latch circuit 256.

The first comparator 252 may output the first logic signal S according to the result of comparison between the first oscillation signal OSCa and the first comparison voltage VRa. The first comparator 252 may compare the first oscillation signal OSCa supplied through a non-inverted input terminal (+) and the first comparison voltage VRa supplied through an inverted input terminal (−), generate the first logic signal S at a logic level changed according to a result of the comparison, and output the first logic signal S to a set terminal S of the SR latch circuit 256.

As illustrated in FIG. 4, the first comparator 252 may output the first logic signal S at a low level L when the first oscillation signal OSCa is less than the first comparison voltage VRa and the first logic signal S at a high level H when the first oscillation signal OSCa is greater than the first comparison voltage VRa. Meanwhile, as illustrated in FIG. 4, the result of the comparison of the first comparator 252 may be output as the first logic signal S after a propagation delay time Δt of the first comparator 252.

The second comparator 254 may output the second logic signal R according to the result of comparison between the second oscillation signal OSCb and the second comparison voltage VRb. The second comparator 254 may compare the second oscillation signal OSCb supplied through a non-inverted input terminal (+) and the second comparison voltage VRb supplied through an inverted input terminal (−), generate the second logic signal R at a logic level changed according to a result of the comparison, and output the second logic signal R to a reset terminal R of the SR latch circuit 256.

As illustrated in FIG. 4, the second comparator 254 may output the second logic signal R at a low level L when the second oscillation signal OSCb is less than the second comparison voltage VRb and the second logic signal R at a high level H when the second oscillation signal OSCb is greater than second comparison voltage VRb. Meanwhile, as illustrated in FIG. 4, the result of the comparison of the second comparator 254 may be output as the second logic signal R after a propagation delay time Δt of the second comparator 254.

The SR latch circuit 256 may receive the first logic signal S of the first comparator 252 as a set signal and the second logic signal R of the second comparator 254 as a reset signal to generate the clock signal Q and the inverted clock signal QB which oscillate according to the set signal S and the reset signal R. The SR latch circuit 256 may generate the output signal Q alternating between a high level H and a low level L and the inverted output signal QB having a phase inverted from that of output signal Q according to the set signal S and the reset signal R.

As described above, in the oscillator according to one embodiment, the first and second intermediate signals SPa and SPb proportional to the changes of the first and second oscillation signals OSCa and OSCb and converging on the second reference voltage Vref2 may be generated using the integrating circuit, the first and second comparison voltages VRa and VRb at the levels adjusted according to changes of the first and second intermediate signals SPa and SPb are used by the comparison circuit 250, and thus a clock signal having a predetermined duty-cycle, that is, a high-precision clock signal, can be generated and output even when the levels of the first and second oscillation signals OSCa and OSCb are different.

Figure 5:
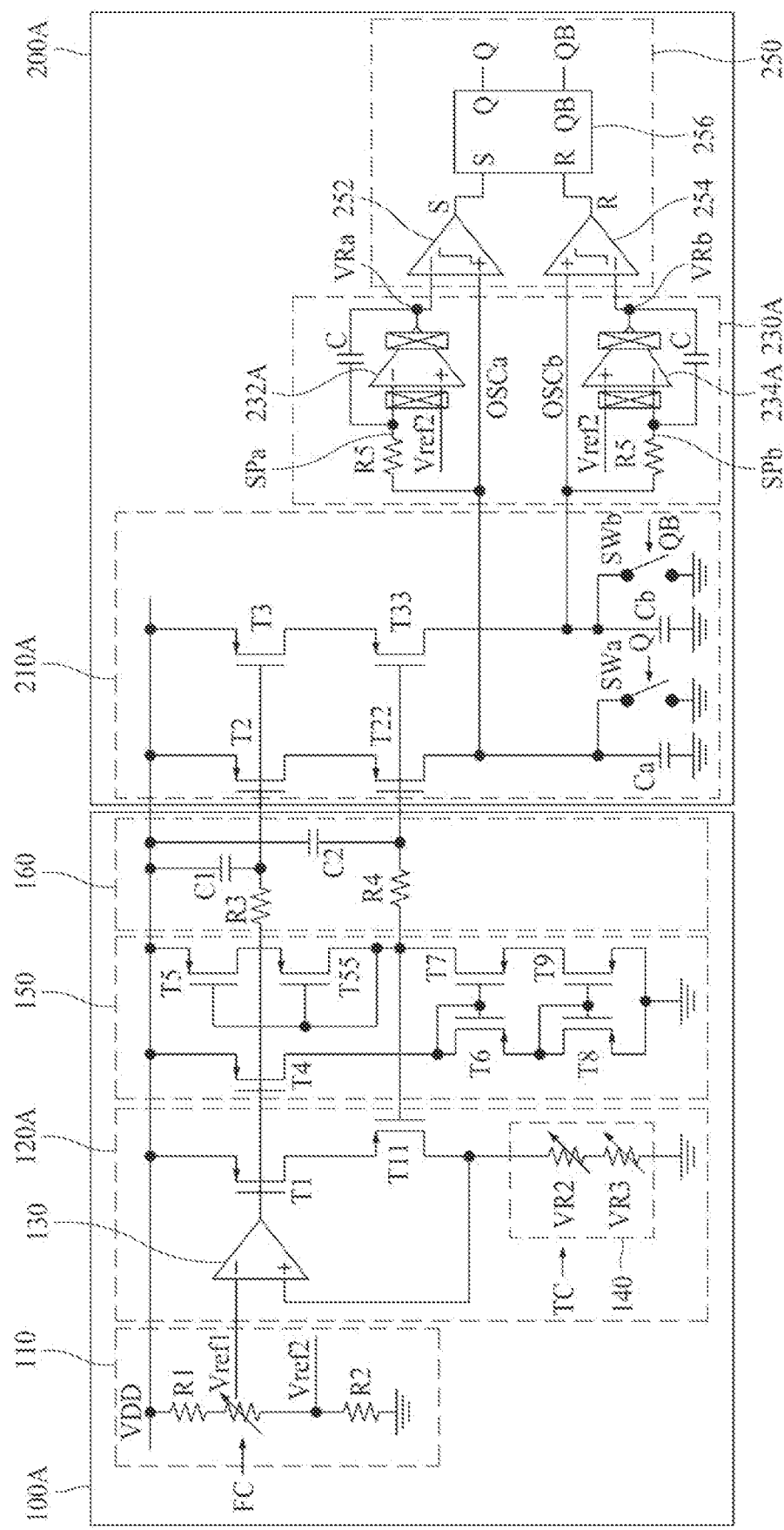
FIG. 5 is an equivalent circuit diagram illustrating a configuration of an oscillator according to one embodiment.

FIG. 5 is an equivalent circuit diagram illustrating a configuration of an oscillator according to one embodiment.

Hereinafter, in FIG. 5, only components which are different from those in FIG. 3 will be described, and descriptions about components which are the same as those in the FIG. 3 will be omitted.

When compared to the oscillator illustrated in FIG. 3, an oscillator illustrated in FIG. 5 may additionally include a cascode stage connected to a first transistor T1 of a bias current generator 120A and an output of a first current mirror circuit including second and third transistors T2 and T3 of a charge and discharge circuit 210A in series.

The cascode stage may include a first-1 transistor T11 connected to an output electrode of the first transistor T1 in series, a second-2 transistor T22 connected to an output electrode of the second transistor T2 in series, and a third-3 transistor T33 connected to an output electrode of the third transistor T3 in series. Gate electrodes of the transistors T11, T22, and T33 of the cascode stage are connected to each other. The cascode stage may maintain a constant current n*Iref by decreasing influence applied to the constant current n*Iref when first and second oscillation signals OSCa and OSCb are slightly changed.

When compared to the oscillator illustrated in FIG. 3, in the oscillator illustrated in FIG. 5, a bias circuit 100A may additionally include a self-bias circuit 150 connected to the bias current generator 120A in parallel and a power noise canceling part 160.

The self-bias circuit 150 may generate an initial bias current in order to operate the bias current generator 120A and supply the initial bias current to the bias current generator 120A. The self-bias circuit 150 may include a fourth transistor T4 connected to the first transistor T1 in the form of a current mirror, a current pass part including fifth transistors T5 and T55 connected to a high-potential power source VDD line in series, a second current mirror including sixth and seventh transistors T6 and T7 connected to the fourth transistor T4 and the current pass part in series, and a third current mirror including eighth and ninth transistors T8 and T9 disposed between and connected to the second current mirror and a low-potential power source GND line.

For example, when power is supplied to the oscillator, the fifth transistors T5 and the T55 of the current pass part may operate to generate the initial bias current flowing through the fourth transistor T4, the second current mirror including the sixth and seventh transistors T6 and T7, and the third current mirror including the eighth and ninth transistors T8 and T9, and the initial bias current may be mirrored and supplied to the bias current generator 120A through the first current mirror circuit to operate the bias current generator 120A.

When compared to the oscillator illustrated in FIG. 3, the oscillator illustrated in FIG. 5 may additionally include a power noise canceling part including a resistor R3 and a capacitor C1 connected to a gate electrode of the first current mirror circuit and a resistor R4 and a capacitor C2 connected to the gate electrode of the cascode stage to remove power noise received through the high-potential power source VDD line.

When compared to the oscillator illustrated in FIG. 3, in the oscillator illustrated in FIG. 5, chopper amplifiers may be used in first and second integrators 232A and 234A included in an integrating circuit 230A. The first and second integrators 232A and 234A in which the chopper amplifiers are used may remove direct current (DC) offsets by periodically switching between a positive (+) input and a negative (−) input and switching between a positive (+) output and a negative (−) output.

As described above, in the oscillator and the method of driving the same according to one aspect, first and second intermediate signals SPa and SPb proportional to changes of the first and second oscillation signals OSCa and OSCb may be generated, first and second comparison voltages VRa and VRb at levels adjusted according to the first and second intermediate signals SPa and SPb may be generated, and a clock may be generated according to a result of comparison between first and second comparison voltages VRa and VRb and the first and second oscillation signals OSCa and OSCb so that a clock signal having a constant duty-cycle, that is, a high-precision clock signal, can be generated and output even when levels of the first and second oscillation signals OSCa and OSCb are changed differently.

It will be apparent to those skilled in the art that various changes and modifications may be made without departing from the spirit and scope of the present disclosure.

In addition, at least a part of the methods described herein may be implemented using one or more computer programs or components. These components may be provided as a series of computer instructions through a computer-readable medium or a machine-readable medium, which includes volatile and non-volatile memories. The instructions may be provided as software or firmware and may be entirely or partially implemented in a hardware configuration such as application specific integrated circuits (ASICs), field programmable gate arrays (FPGAs), digital signal processors (DSPs), or other similar devices. The instructions may be configured to be executed by one or more processors or other hardware components, and when one or more processors or other hardware components execute the series of computer instructions, one or more processors or other hardware components may entirely or partially perform the methods and procedures disclosed herein.

Those skilled in the art to which the present disclosure pertains will understand that the above-described present disclosure may be embodied in other specific forms without changing the technical spirit or essential features thereof.

Therefore, it should be understood that the embodiments described above are illustrative in all respects and not restrictive. The protection scope of the present disclosure should be construed by the claims, and all technological ideas within the equivalent scope thereof should be construed as being included in the scope of rights of the present disclosure.

What is claimed is:

1. An oscillator comprising:
   a charge and discharge circuit which generates a first oscillation signal according to a clock signal using a first constant current and a second oscillation signal according to an inverted clock signal using a second constant current;
   an integrating circuit which generates a first comparison voltage reflecting an amount of change in the first oscillation signal based on a comparison reference voltage and a second comparison voltage reflecting an amount of change in the second oscillation signal based on the comparison reference voltage; and a comparison circuit which generates the clock signal and the inverted clock signal according to a result of comparison between the first oscillation signal and the first comparison voltage and a result of comparison between the second oscillation signal and the second comparison voltage, wherein the integrating circuit includes:

a first integrator which generates the first comparison voltage by integrating a difference between the first oscillation signal and the comparison reference voltage; and a second integrator which generates the second comparison voltage by integrating a difference between the second oscillation signal and the comparison reference voltage.

2. The oscillator of claim 1, further comprising a bias circuit which generates a bias reference voltage and the comparison reference voltage according to a frequency control signal and generates a bias current using the bias reference voltage, wherein the charge and discharge circuit generates the first and second constant currents proportional to the bias current by mirroring the bias current.

3. The oscillator of claim 2, wherein the bias circuit includes:

a reference voltage generator which generates the bias reference voltage and the comparison reference voltage which is less than the bias reference voltage according to the frequency control signal; and a bias current generator which generates a constant current proportional to the bias reference voltage as the bias current, wherein the bias current generator includes a temperature compensation resistor part to which the bias current is supplied and which maintains a constant resistance value according to a change in temperature.

4. The oscillator of claim 3, wherein the charge and discharge circuit includes:

a constant current generator which generates the first and second constant currents by mirroring the bias current;

a first charge and discharge part which generates the first oscillation signal through charging and discharging operations of a first capacitor according to control of the clock signal using the first constant current; and a second charge and discharge part which generates the second oscillation signal through charging and discharging operations of a second capacitor according to control of the inverted clock signal using the second constant current.

5. The oscillator of claim 4, wherein the bias current generator and the constant current generator include:

a first current mirror which generates the bias current and the first and second constant currents; and a cascode stage connected to an output terminal of the first current mirror in series, wherein the bias current and the first and second constant currents are output through the cascode stage.

6. The oscillator of claim 5, further comprising:

a self-bias circuit which is connected to the bias current generator in parallel, generates an initial bias current, and supplies the initial bias current to the bias current generator; and a power noise canceling part including a first capacitor and a first resistor, which are disposed between and connected to a high-potential power line and a gate electrode of the first current mirror, and a second capacitor and a second resistor which are disposed between and connected to the high-potential power line and a gate electrode of the cascode stage.

7. The oscillator of claim 1, wherein:

the first integrator receives the first oscillation signal through a first input resistor connected to a first-1 input terminal in series, the comparison reference voltage through a first-2 input terminal, and a first intermediate signal formed by adding a voltage fed back from the first comparison voltage output through a first output terminal through a first feedback capacitor, to an output power of the first input resistor through the first-1 input terminal and integrates the first oscillation signal, the comparison reference voltage, and the first intermediate signal; and the second integrator receives the second oscillation signal through a second input resistor connected to a second-1 input terminal in series, the comparison reference voltage through a second-2 input terminal, and a second intermediate signal formed by adding a voltage fed back from the second comparison voltage output through a second output terminal through a second feedback capacitor, to an output power of the second input resistor through the second-1 input terminal and integrates the second oscillation signal, the comparison reference voltage, and the second intermediate signal.

8. The oscillator of claim 7, wherein:

the first intermediate signal is proportional to the amount of change in the first oscillation signal based on the comparison reference voltage and converges on the comparison reference voltage; and the second intermediate signal is proportional to the amount of change in the second oscillation signal based on the comparison reference voltage and converges on the comparison reference voltage.

9. The oscillator of claim 8, wherein:

a level of the first comparison voltage is changed according to a change of the first intermediate signal which is less than the first comparison voltage;

a level of the second comparison voltage is changed according to a change of the second intermediate signal which is less than the second comparison voltage; and each of the first comparison voltage and the second comparison voltage is greater than the comparison reference voltage.

10. The oscillator of claim 1, wherein the comparison circuit includes:

a first comparator which outputs a first logic signal according to the result of comparison between the first oscillation signal and the first comparison voltage;

a second comparator which outputs a second logic signal according to the result of comparison between the second oscillation signal and the second comparison voltage; and a set-reset (SR) latch circuit which receives the first logic signal as a set signal and the second logic signal as a reset signal and generates and outputs the clock signal alternating between a first logic level and a second logic level and the inverted clock signal having a phase inverted from that of the clock signal.

11. A method of driving an oscillator, comprising:

generating a first constant current and a second constant current using a bias current;

generating a first oscillation signal according to a clock signal using the first constant current and generating a second oscillation signal according to an inverted clock signal using the second constant current;

generating a first comparison voltage reflecting an amount of change in the first oscillation signal based on a comparison reference voltage and generating a second comparison voltage reflecting an amount of change in the second oscillation signal based on the comparison reference voltage; and generating the clock signal and the inverted clock signal according to a result of comparison between the first oscillation signal and the first comparison voltage and a result of comparison between the second oscillation signal and the second comparison voltage, wherein generating the first comparison voltage and the second comparison voltage comprises:

generating, by a first integrator, the first comparison voltage by integrating a difference between the first oscillation signal and the comparison reference voltage; and generating, by a second integrator, the second comparison voltage by integrating a difference between the second oscillation signal and the comparison reference voltage.

12. The method of claim 11, wherein:

the first integrator receives the first oscillation signal through a first input resistor connected to a first-1 input terminal in series, the comparison reference voltage through a first-2 input terminal, and a first intermediate signal formed by adding a voltage fed back from the first comparison voltage output through a first output terminal through a first feedback capacitor, to an output power of the first input resistor through the first-1 input terminal and integrates the first oscillation signal, the comparison reference voltage, and the first intermediate signal; and the second integrator receives the second oscillation signal through a second input resistor connected to a second-1 input terminal in series, the comparison reference voltage through a second-2 input terminal, and a second intermediate signal formed by adding a voltage fed back from the second comparison voltage output through the second output terminal through a second feedback capacitor, to an output power of the second input resistor through the second-1 input terminal and integrates the second oscillation signal, the comparison reference voltage, and the second intermediate signal.

13. The method of claim 12, wherein:

the first intermediate signal is proportional to an amount of change in the first oscillation signal based on the comparison reference voltage and converges on the comparison reference voltage;

the second intermediate signal is proportional to an amount of change in the second oscillation signal based on the comparison reference voltage and converges on the comparison reference voltage;

a level of the first comparison voltage is changed according to a change of the first intermediate signal; and a level of the second comparison voltage is changed according to a change of the second intermediate signal.

14. The method of claim 11, further comprising generating a bias reference voltage and the comparison reference voltage according to a frequency control signal and the bias current using the bias reference voltage, wherein the first and second constant currents which are proportional to the bias current are generated by mirroring the bias current.

* * * * *